United States Patent
Matsumoto

(10) Patent No.: US 9,256,504 B2
(45) Date of Patent: Feb. 9, 2016

(54) SEMICONDUCTOR INTEGRATED CIRCUIT INCLUDING A STATE MACHINE

(71) Applicant: SOCIONEXT INC., Yokohama-shi, Kanagawa (JP)

(72) Inventor: Yusuke Matsumoto, Akiruno (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/065,880

(22) Filed: Oct. 29, 2013

(65) Prior Publication Data

US 2014/0129889 A1  May 8, 2014

(30) Foreign Application Priority Data

Nov. 8, 2012  (JP) ................................ 2012-246547

(51) Int. Cl.
*G06F 11/27* (2006.01)
*G01R 31/3177* (2006.01)
*G01R 31/3185* (2006.01)

(52) U.S. Cl.
CPC ............ *G06F 11/27* (2013.01); *G01R 31/3177* (2013.01); *G01R 31/318555* (2013.01); *G01R 31/318594* (2013.01)

(58) Field of Classification Search
CPC ................. G01R 31/3187; G01R 31/318547; G01R 31/31724; G01R 31/3177; G01R 31/318572; G01R 31/318558; G01R 31/318536; G01R 31/318555; G01R 31/318544; G01R 31/318594
USPC .......................... 714/724, 726, 732, 736, 733
See application file for complete search history.

(56) References Cited

U.S. PATENT DOCUMENTS

| | | | | |
|---|---|---|---|---|
| 5,515,530 | A * | 5/1996 | Eskandari | 714/1 |
| 6,334,200 | B1 * | 12/2001 | Fujiwara et al. | 714/738 |
| 6,675,332 | B1 * | 1/2004 | Suzuki et al. | 714/724 |
| 7,219,269 | B2 * | 5/2007 | Frisch | 714/700 |
| 7,231,563 | B2 * | 6/2007 | Vinke et al. | 714/718 |
| 7,480,838 | B1 * | 1/2009 | Wilkerson et al. | 714/700 |
| 7,640,474 | B2 * | 12/2009 | Seibold | 714/727 |
| 7,958,414 | B1 * | 6/2011 | Ansari et al. | 714/718 |
| 8,074,125 | B2 * | 12/2011 | Lee | 714/700 |
| 8,612,815 | B2 * | 12/2013 | Pakbaz et al. | 714/733 |
| 8,621,303 | B1 * | 12/2013 | Kantipudi et al. | 714/731 |
| 2004/0193977 | A1 * | 9/2004 | Kejariwal et al. | 714/724 |
| 2005/0034041 | A1 * | 2/2005 | Casarsa | 714/733 |
| 2005/0278596 | A1 | 12/2005 | Miyajima et al. | |
| 2006/0053353 | A1 * | 3/2006 | Youn et al. | 714/718 |
| 2009/0193305 | A1 * | 7/2009 | Liu et al. | 714/727 |

FOREIGN PATENT DOCUMENTS

JP   2005-339675   12/2005

* cited by examiner

*Primary Examiner* — James C Kerveros
(74) *Attorney, Agent, or Firm* — Staas & Halsey LLP

(57) ABSTRACT

A state machine; a BIST circuit including a test pattern generator and an expected value comparison circuit; a state monitoring circuit configured to monitor whether or not a state of the state machine is a specific state; and a transition request detection circuit configured to detect a transition request signal from the specific state to a next state, are held. When the state monitoring circuit decides that the state of the state machine is the specific state, the state machine outputs a signal indicating the specific state as a state output of the state machine, and the BIST circuit performs a test of the state machine. When the transition request detection circuit detects the transition request signal while the test is performed, the BIST circuit stops the test of the state machine.

8 Claims, 7 Drawing Sheets

F I G. 1
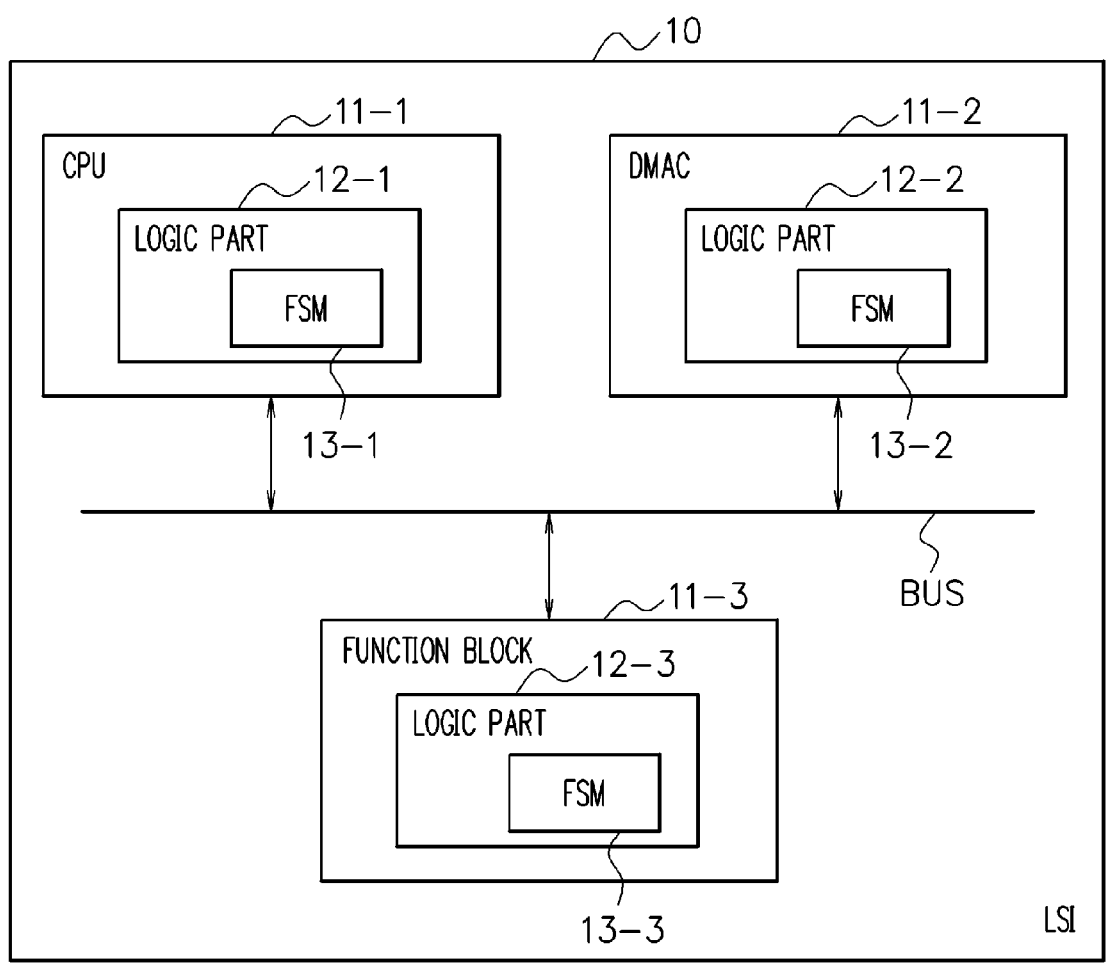

F I G. 7
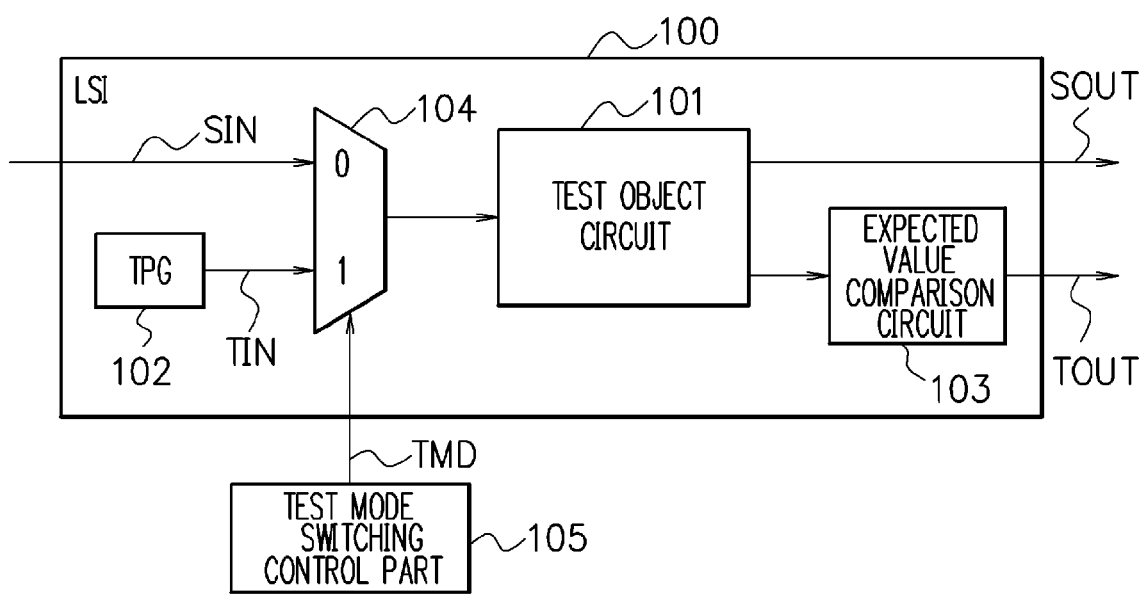

SEMICONDUCTOR INTEGRATED CIRCUIT INCLUDING A STATE MACHINE

CROSS-REFERENCE TO RELATED APPLICATION

This application is based upon and claims the benefit of priority of the prior Japanese Patent Application No. 2012-246547, filed on Nov. 8, 2012, the entire contents of which are incorporated herein by reference.

FIELD

The embodiments discussed herein are directed to a semiconductor integrated circuit including a test circuit.

BACKGROUND

A semiconductor integrated circuit such as an LSI (Large Scale Integration) mounted on products such as vehicles, medical devices is required to prevent occurrences of troubles by a system before incurring a serious trouble by performing a failure detection. An idea improving security by mounting a function to reduce a risk when an element constituting the system and a mounted component are failed is called as a functional safety.

A general test method of the LSI is that a test pattern is input to the LSI by using an LSI tester, an output value thereof is taken into the LSI tester, it is compared with an expected value to decide presence/absence of failure. There is a BIST (Built in Self-Test) as one technology for a design for testability (DFT) of the LSI. According to the BIST, it is possible to decide the presence/absence of failure by a single LSI by including a test pattern generation circuit generating the test pattern and an expected value comparison circuit comparing the output value and the expected value in the LSI in advance and performing the test of the LSI. The test of the LSI using the BIST circuit is generally performed before shipping of the LSI.

FIG. 7 is a diagram illustrating a configuration example of a BIST circuit. An LSI 100 having the BIST circuit includes a test object circuit 101, a test pattern generator (TPG) 102, an expected value comparison circuit 103, and a multiplexer 104. A normal input SIN or a test input TIN is input to the test object circuit 101 via the multiplexer 104 controlled by a mode signal TMD from a test mode switching control part 105. In a normal operation, the normal input SIN is input to the test object circuit 101, and in a test operation, the test input TIN being a test pattern generated by the test pattern generator 102 is input to the test object circuit 101. The test object circuit 101 outputs an output value being a process result as a normal output SOUT. In the test operation, the expected value comparison circuit 103 decides the presence/absence of failure by comparing the output value of the test object circuit 101 and the expected value, and outputs a decision result as a test output (admission decision) TOUT.

Besides, a BIST circuit including an expected value generation circuit receiving an output signal from an interface part to a memory circuit and generating an expected value signal, and a comparison decision circuit performing a decision of matching or unmatching by comparing the output signal of the interface part and the expected value signal, and capable of performing a test of the interface part of a memory LSI is proposed (for example, refer to Patent Document 1).

[Patent Document 1] Japanese Laid-open Patent Publication No. 2005-339675

A BIST circuit of the related art is a circuit assumed to perform a test of an LSI when the LSI is before shipping and a test object circuit is in a non-operation state such as in a sleep mode, and it is not assumed to perform the test when the LSI is in actual operation. It is desirable that it is possible to perform the test by using the BIST circuit even in actual operation after the LSI is incorporated in a product or a system from a point of view of functional safety. There is a finite state machine (FSM) being an important component managing a control function as one of logic circuits whose reliability is required in the LSI.

SUMMARY

An aspect of a semiconductor integrated circuit includes: a state machine; a test circuit configured to perform a test of the state machine; a monitoring circuit configured to monitor whether or not a state of the state machine is a first state; and a detection circuit configured to detect a transition request signal requesting a transition from the first state to a second state. When the monitoring circuit decides that the state of the state machine is the first state, the test circuit performs the test of the state machine, and the state machine outputs information indicating the first state as the state output of the state machine. When the detection circuit detects the transition request signal while the test of the state machine is performed by the test circuit, the test circuit stops the test of the state machine.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating an example of an LSI chip including semiconductor integrated circuits according to the present embodiment;

FIG. 7 is a diagram illustrating a configuration example of a BIST circuit.

DESCRIPTION OF EMBODIMENTS

Preferred embodiments will be explained with reference to accompanying drawings.

FIG. 1 is a block diagram illustrating a configuration example of an LSI chip including semiconductor integrated circuits according to the present embodiment. The LSI chip 10 includes, for example, a CPU (Central Processing Unit)

11-1, a DMAC (Direct Memory Access Controller) 11-2, and a peripheral function block 11-3, and so on, and these are communicatively connected with each other via a bus BUS. The CPU 11-1, the DMAC 11-2, and the peripheral function block 11-3 are examples of the semiconductor integrated circuit in the present embodiment. Note that an example in which the LSI chip 10 includes three circuits of the CPU 11-1, the DMAC 11-2, and the peripheral function block 11-3 is exemplified in FIG. 1, but it is not limited thereto, and the LSI chip 10 may include one or plural other circuits.

The CPU 11-1 controls each function part held by the LSI chip 10 by reading and executing programs. The DMAC 11-2 performs a communication control relating to a DMA transfer performing a data transfer between functional parts held by the LSI chip 10 without being intervened by the CPU 11-1. The peripheral function block 11-3 performs certain functional processes. Each of the CPU 11-1, the DMAC 11-2, the peripheral function block 11-3 has a logic part 12 of a digital circuit. The logic part 12 includes a finite state machine (FSM) 13, and a BIST (Built in Self-Test) circuit being a built-in test circuit to perform a test (failure detection) of the finite state machine 13.

Figure 2:
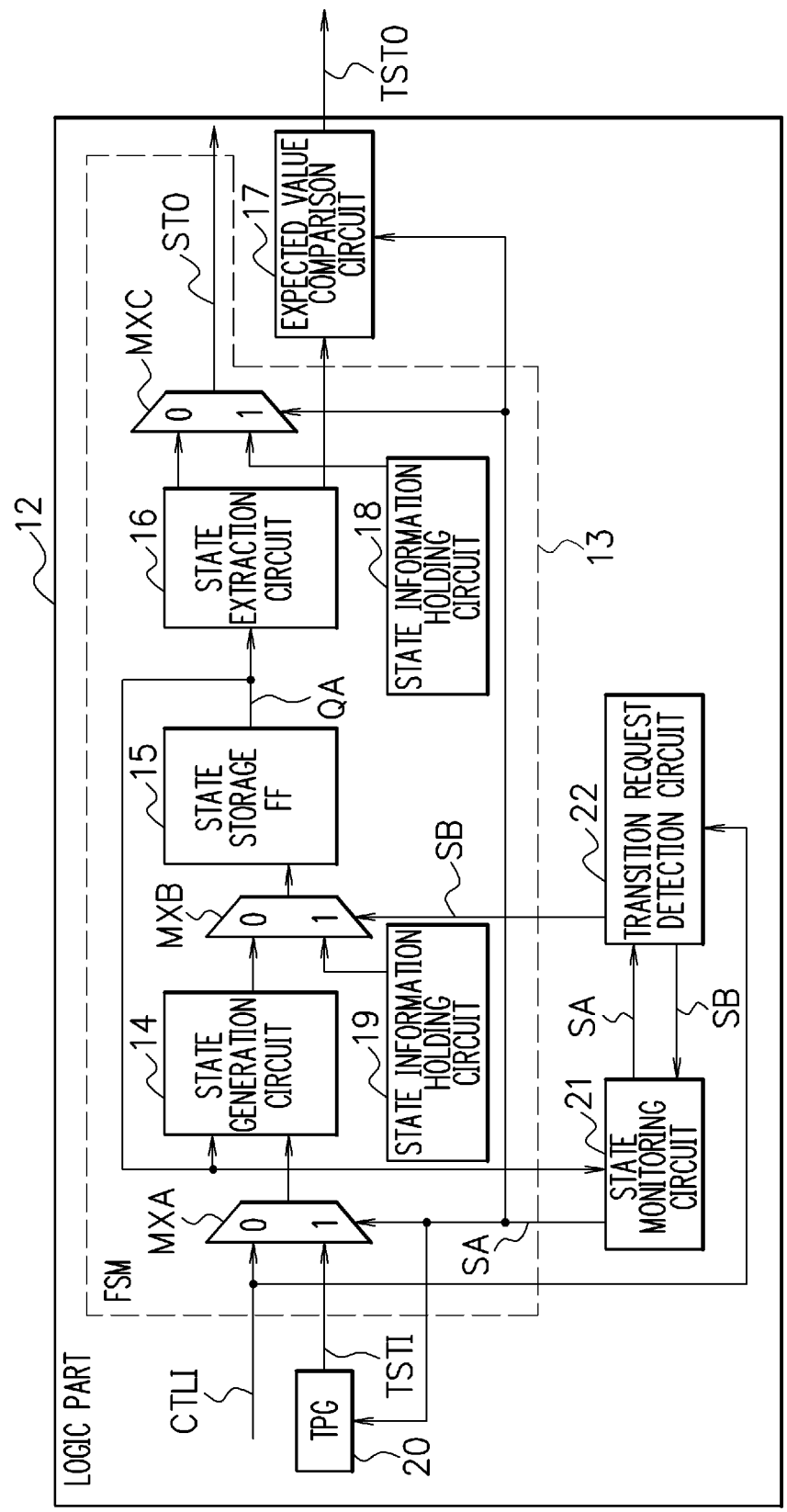
FIG. 2 is a diagram illustrating a configuration example of the semiconductor integrated circuit according to the present embodiment.

FIG. 2 is a diagram illustrating a configuration example of the semiconductor integrated circuit according to the present embodiment. In FIG. 2, the finite state machine (FSM) 13 and functional parts relating to execution of the test (failure detection) thereof are illustrated among functional parts held by the logic part 12 of the semiconductor integrated circuit in the present embodiment. Note that the logic part 12 also includes the functional parts relating to the other processes which can be executed at the semiconductor integrated circuit though they are not illustrated.

The logic part 12 includes the finite state machine 13, an expected value comparison circuit 17, a test pattern generator (TPG) 20, a state monitoring circuit 21, and a transition request detection circuit 22. The finite state machine 13 includes a state generation circuit 14, a state storage flip-flop 15, a state extraction circuit 16, state information holding circuits 18, 19, and multiplexers MXA, MXB, MXC.

The state generation circuit 14 generates a state where the state machine shifts subsequently based on an output QA of the state storage flip-flop 15 and an external input from the multiplexer MXA. A signal SA which is set at "0" (zero) (low level) in a normal operation mode, and at "1" (high level) in a test mode is input to the multiplexer MXA as a selection signal. The multiplexer MXA outputs a control input CTLI or a test input TSTI as an external input in accordance with the signal SA.

Namely, the multiplexer MXA outputs the control input CTLI as the external input in the normal operation mode, and outputs the test input TSTI as the external input in the test mode in accordance with the signal SA. Accordingly, the state generation circuit 14 generates the state to be shifted subsequently based on the output QA of the state storage flip-flop 15 and the control input CTLI in the normal operation mode, and generates the state to be shifted subsequently based on the output QA of the state storage flip-flop 15 and the test input TSTI in the test mode. The control input CTLI is a signal output from peripheral circuits as a request, and the test input TSTI is a test pattern generated by the test pattern generator 20.

The state storage flip-flop 15 stores a current state of the state machine. An output value of the state generation circuit 14 or a value held at the state information holding circuit 19 is input to the state storage flip-flop 15 via the multiplexer MXB. A signal SB which is set at "1" (high level) at a return time from the test mode to the normal operation mode is input to the multiplexer MXB as the selection signal. The multiplexer MXB outputs the output value of the state generation circuit 14 or the value held at the state information holding circuit 19 in accordance with the signal SB. Namely, at the return time from the test mode to the normal operation mode, the value held at the state information holding circuit 19 is input to the state storage flip-flop 15, and in the other cases, the output value of the state generation circuit 14 is input to the state storage flip-flop 15.

The state extraction circuit 16 decodes the output QA of the state storage flip-flop 15 and outputs a signal indicating the state. The output signal of the state extraction circuit 16 is input to the multiplexer MXC and the expected value comparison circuit 17. The signal SA is input to the multiplexer MXC as the selection signal. The multiplexer MXC outputs the output signal of the state extraction circuit 16 or a signal held at the state information holding circuit 18 as a state output STO in accordance with the signal SA. Namely, the multiplexer MXC outputs the output signal of the state extraction circuit 16 as the state output STO in the normal operation mode, and outputs the signal held at the state information holding circuit 18 as the state output STO in the test mode.

The expected value comparison circuit 17 compares the output value (output signal) of the state extraction circuit 16 and the expected value, decides presence/absence of failure, and outputs a decision result as a test output (admission decision) TSTO. For example, a flag indicating a failure detection is set at the test output (admission decision) TSTO when the failure is detected. The test pattern generator 20 generates and outputs a series of certain programmed test pattern. Operations of the expected value comparison circuit 17 and the test pattern generator 20 are controlled by the signal SA, and they operate when the signal SA is "1", namely, when it is in the test mode, and stop their operations in the normal operation mode.

The state monitoring circuit 21 monitors whether or not the output QA of the state storage flip-flop 15, namely, the current state of the state machine is a first state, for example, a specific state. A signal indicating the specific state is held at the state information holding circuit 18. The state monitoring circuit 21 sets the signal SA to be output at "0" (zero) when the current state of the state machine is not the specific state in the normal operation mode. The state monitoring circuit 21 asserts the signal SA to be output from "0" (zero) to "1" when the current state of the state machine becomes the specific state in the normal operation mode, and maintains the signal SA at "1" until the signal SB from the transition request detection circuit 22 is set at "1". Note that the state monitoring circuit 21 does not perform a monitoring operation as for the current state of the state machine in the test mode when the signal SA is "1".

The transition request detection circuit 22 operates when the signal SA from the state monitoring circuit 21 is "1", namely, in the test mode, and stops the operation in the normal operation mode. The transition request detection circuit 22 detects whether or not a transition request signal requesting a transition from the above-stated specific state to a second state, for example, a next state is input by the control input CTLI during the test mode. The next state to be shifted from the specific state is determined in advance, and a value indicating the next state to be shifted from the specific state is held at the state information holding circuit 19. The transition request detection circuit 22 sets the signal SB to be output to "1" when the transition request signal from the specific state to the next state is detected during the test mode.

Figure 3:
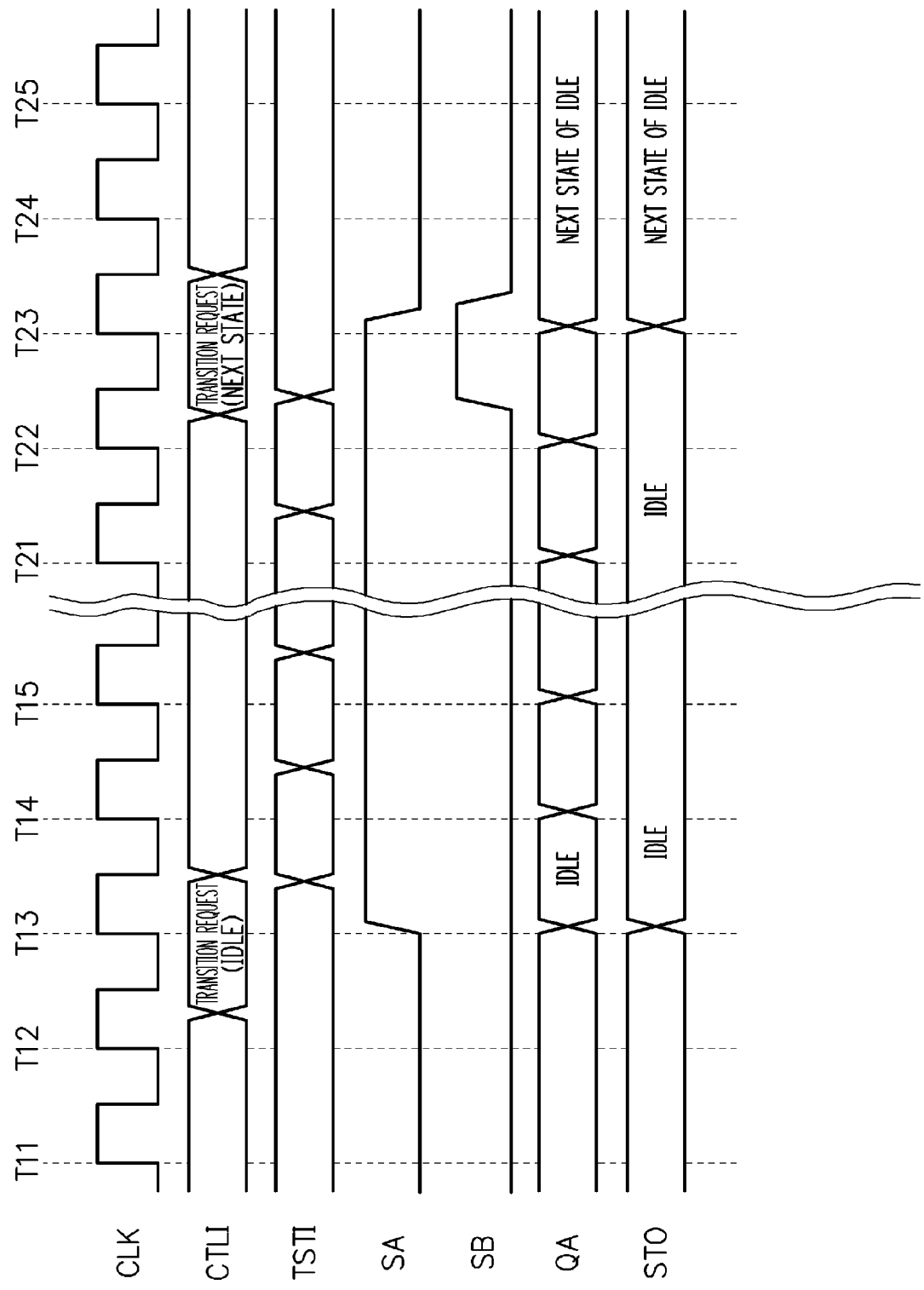
FIG. 3 is a timing chart illustrating an operation example of the semiconductor integrated circuit according to the present embodiment.

Next, operations of the semiconductor integrated circuit according to the present embodiment are described. FIG. 3 is a timing chart illustrating an operation example of the semiconductor integrated circuit illustrated in FIG. 2. Note that in the following, the specific state to enter the test mode is set to be an IDLE state as an example. When the state of the state machine becomes the IDLE state in the normal operation mode, the mode transfers to the test mode, and the mode returns to the normal operation mode when the transition request signal from the IDLE state to the next state is received by the control input CTLI in the test mode. Note that the specific state entering the test mode is not limited to the IDLE state, but it may be a low power consumption state, and so on. It is arbitrary as long as the state does not change frequently.

Figure 4:
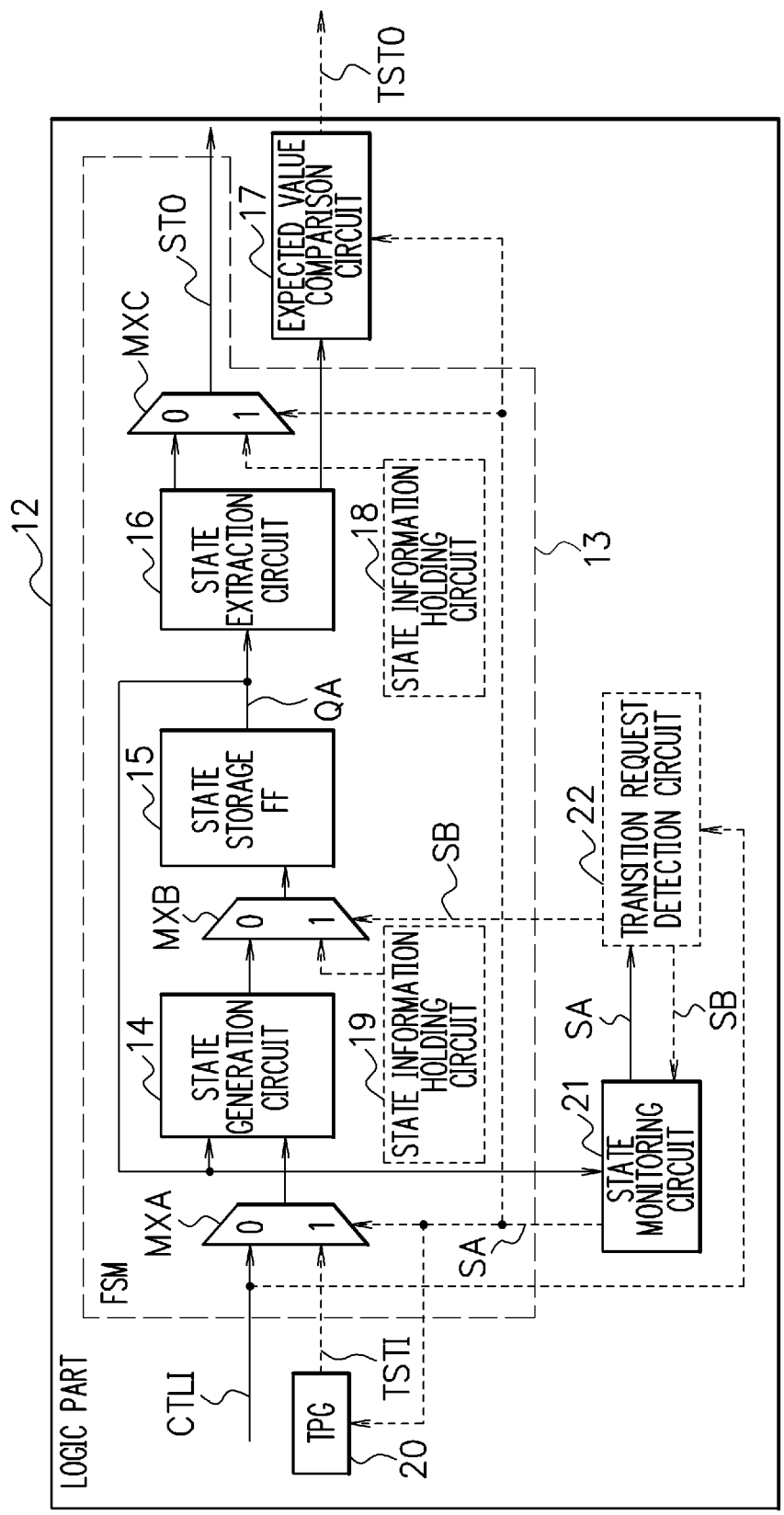
FIG. 4 is a diagram to explain a normal operation of the semiconductor integrated circuit according to the present embodiment.

When the mode is the normal operation mode and the current state of the state machine is not the IDLE state (for example, times T11, T12), the signal SA from the state monitoring circuit 21 is "0" (zero), and the signal SB from the transition request detection circuit 22 is "0" (zero). At this time, as illustrated in FIG. 4, the control input CTLI is selected by the multiplexer MXA, and is input to the state generation circuit 14 as the external input. The output signal of the state extraction circuit 16 is selected by the multiplexer MXC and is output as the state output STO. The output value of the state generation circuit 14 is selected by the multiplexer MXB, and is input to the state storage flip-flop 15.

Accordingly, the state generation circuit 14 generates the state to be shifted subsequently based on the control input CTLI and the output QA of the state storage flip-flop 15 indicating the current state of the state machine. The state storage flip-flop 15 stores the output value of the state generation circuit 14. The state extraction circuit 16 decodes the output QA of the state storage flip-flop 15 and outputs the signal indicating the state, and the signal is output as the state output STO. Namely, the finite state machine 13 performs the normal operation. Note that at this time, the test pattern generator 20, the expected value comparison circuit 17, and the transition request detection circuit 22 stop their operations. The state monitoring circuit 21 performs the monitoring of whether or not the current state of the state machine is the IDLE state by the output QA of the state storage flip-flop 15.

As illustrated in time T13 in FIG. 3, when the control input CTLI requesting the transition to the IDLE state is input in the normal operation mode, the state of the state machine shifts to the IDLE state at a rising of a clock CLK at the time T13. When the state monitoring circuit 21 decides that the current state of the state machine is the IDLE state by the output QA of the state storage flip-flop 15, the state monitoring circuit 21 asserts the signal SA to be output to "1". Note that the signal SB from the transition request detection circuit 22 is "0" (zero).

Figure 5:
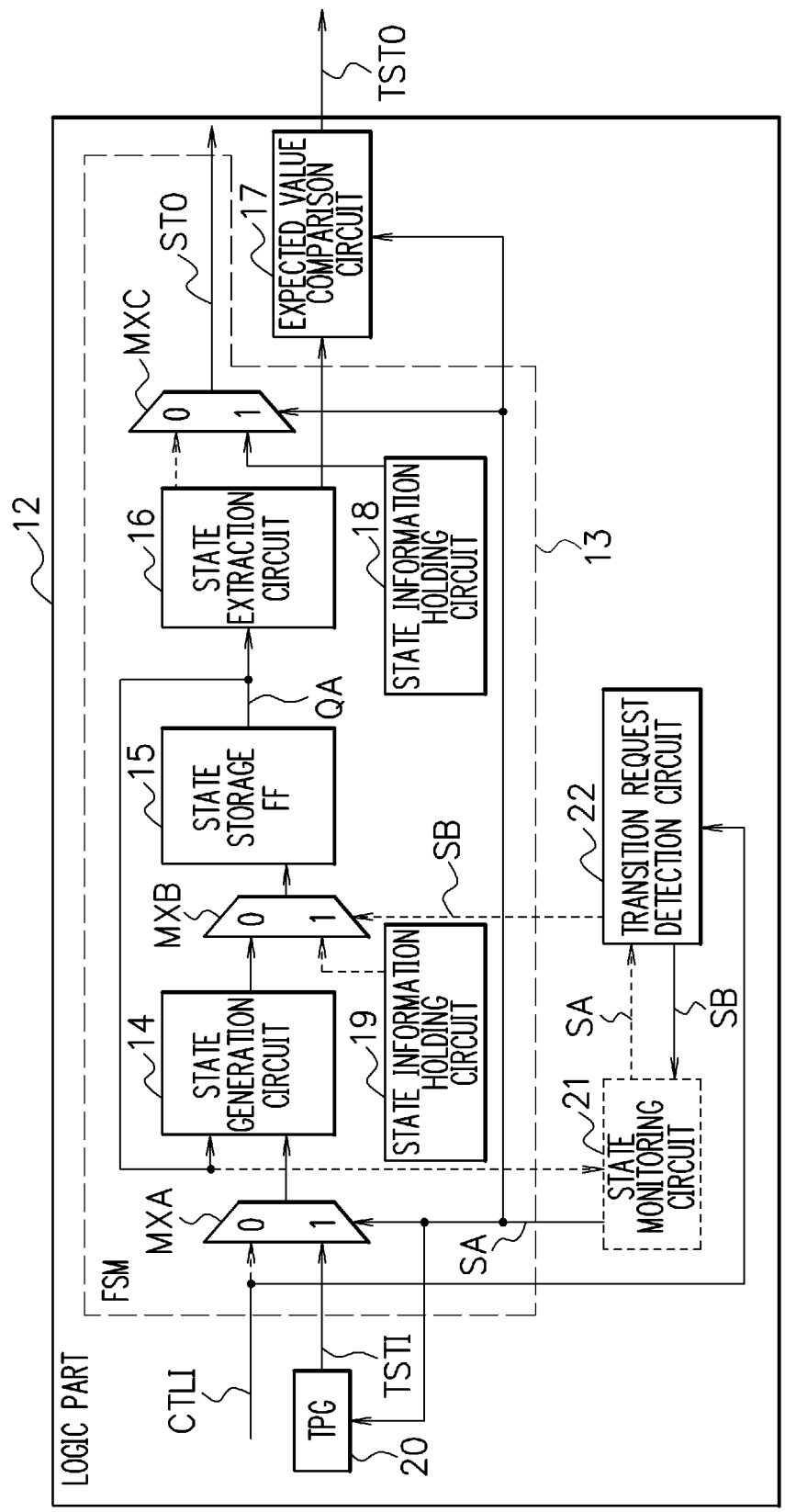
FIG. 5 is a diagram to explain a test operation of the semiconductor integrated circuit according to the present embodiment.

The output signal SA from the state monitoring circuit 21 is set at "1", and thereby, the mode transfers from the normal operation mode to the test mode, and the test pattern generator 20, the expected value comparison circuit 17, and the transition request detection circuit 22 perform respective operations. As illustrated in FIG. 5, the output signal SA is set at "1", and thereby, the test input TSTI being the test pattern generated at the test pattern generator 20 is selected by the multiplexer MXA, and is input to the state generation circuit 14 as the external input. The signal indicating the IDLE state as the specific state held at the state information holding circuit 18 is selected by the multiplexer MXC, and is output as the state output STO.

Accordingly, the state generation circuit 14 generates the state to be shifted subsequently based on the test input TSTI being the test pattern and the output QA of the state storage flip-flop 15, the state storage flip-flop 15 stores the output value of the state generation circuit 14. The state extraction circuit 16 outputs a signal indicating the state obtained by decoding the output QA of the state storage flip-flop 15 to the expected value comparison circuit 17. The expected value comparison circuit 17 compares the output value (output signal) of the state extraction circuit 16 in accordance with the test pattern of the test input TSTI and the expected value, and thereby, decides the presence/absence of the failure. The test (failure detection) of the finite state machine 13 by the BIST circuit is performed as stated above (times T13, T14, T15, T21, T22). At this time, the signal indicating the IDLE state is continued to be output toward outside by the multiplexer MXC as the state output STO, and therefore, there is no effect on the outside such as the peripheral circuits even if the test (failure detection) is performed at the finite state machine 13.

Note that when the output signal SA from the state monitoring circuit 21 is set at "1" and the mode enters the test mode, the transition request detection circuit 22 is enabled so as to be able to detect the transition request from the IDLE state to the next state by the control input CTLI. The transition request detection circuit 22 detects the transition request by the control input CTLI. Besides, when the mode enters the test mode, the state monitoring circuit 21 does not perform the monitoring operation until the signal SB from the transition request detection circuit 22 is set at "1" so as not to detect the IDLE state during the test operation.

Figure 6:
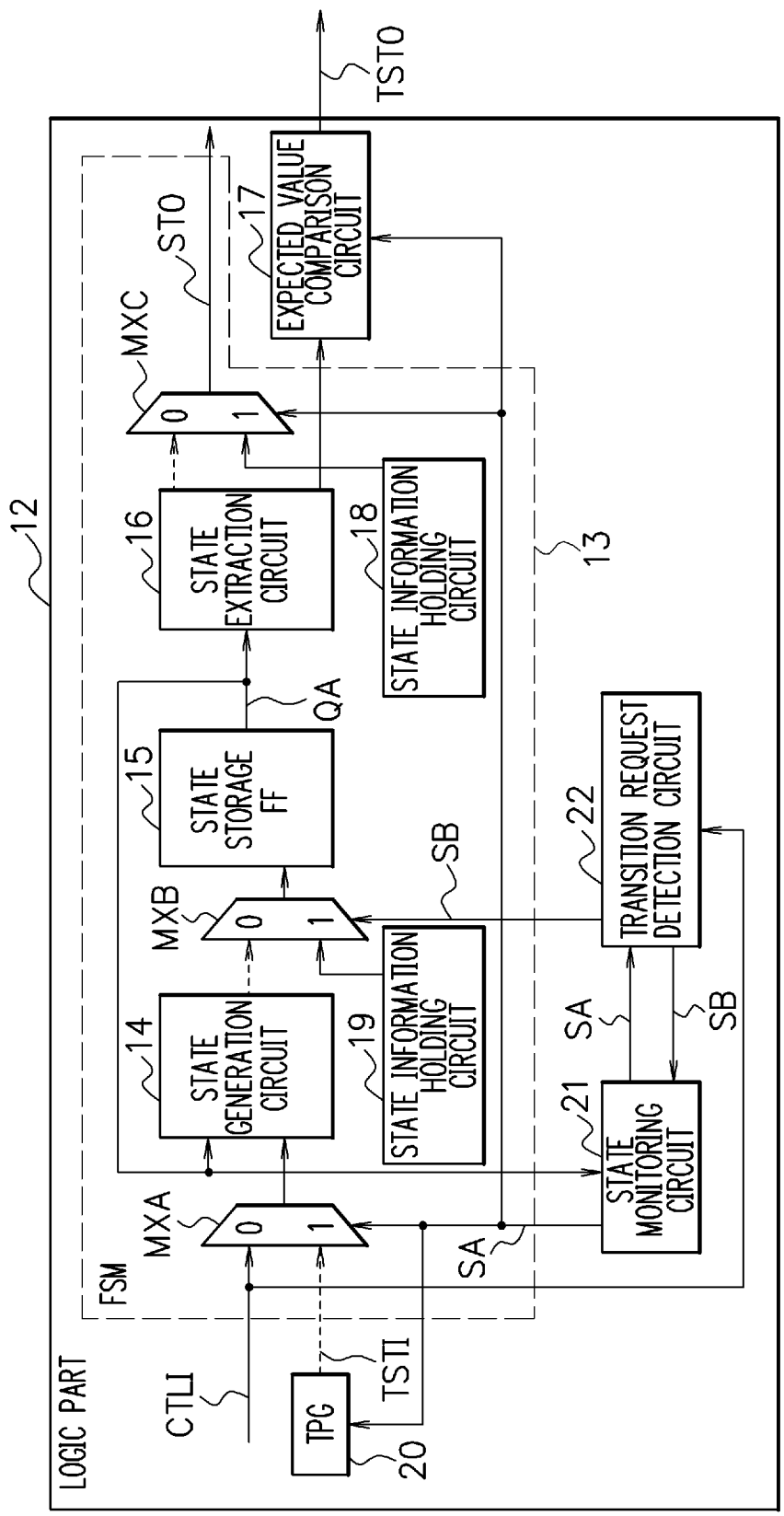
FIG. 6 is a diagram to explain a transfer operation of the semiconductor integrated circuit according to the present embodiment from a test mode to a normal operation mode.

As illustrated in times T22 to T23 in FIG. 3, when the control input CTLI requesting the transition from the IDLE state to the next state is input in the test mode, the transition request detection circuit 22 detects this transition request signal, and asserts the signal SB to be output to "1". The value indicating the next state held at the state information holding circuit 19 is thereby selected by the multiplexer MXB, and is output to the state storage flip-flop 15 as illustrated in FIG. 6.

At the rising of the clock CLK at the time T23, the value indicating the next state held at the state information holding circuit 19 is stored at the state storage flip-flop 15, and the output QA becomes the value indicating the state next to the IDLE state. The current of the state machine indicated by the output QA of the state storage flip-flop 15 is not the IDLE state, and therefore, the output signal SA from the state monitoring circuit 21 becomes "0" (zero). Accordingly, the control input CTLI is selected by the multiplexer MXA, and is input to the state generation circuit 14 as the external input, and the output signal of the state extraction circuit 16 is selected by the multiplexer MXC and is output as the state output STO. The test pattern generator 20, the expected value comparison circuit 17, and the transition request detection circuit 22 stop their operations.

The mode thereby returns from the test mode to the normal operation mode, and the finite state machine 13 performs the normal operation (times T24, T25). Besides, at the rising of the clock CLK subsequent to the detection of the transition request signal, the value indicating the next state held at the state information holding circuit 19 is stored at the state storage flip-flop 15, and the mode promptly returns from the test mode to the normal operation mode. Therefore, it is possible to perform the test (failure detection) of the state machine by the BIST circuit without disturbing the normal operation.

According to the present embodiment, when the state of the finite state machine 13 shifts to the specific state during the actual operation, it is possible to perform the test (failure detection) of the state machine by the BIST circuit by transferring to the test mode. During the test mode, the signal indicating the specific state held at the state information holding circuit 18 is continued to be output toward outside as the state output STO, and therefore, it is possible to perform the test (failure detection) of the finite state machine 13 without affecting on the outside such as the peripheral circuits. Besides, the value indicating the next state held at the state information holding circuit 19 is stored at the state storage flip-flop 15 at the rising of the clock subsequent to the detection of the transition request signal from the specific state to the next state. It is thereby possible to promptly return from the test mode to the normal operation mode, and to perform the test (failure detection) of the finite state machine 13 without disturbing the normal operation.

A disclosed semiconductor integrated circuit performs a test of a state machine by a test circuit while outputting information indicating a first state as a state output when a state of the state machine transfers to the first state, and therefore, it is possible to perform the test without affecting an outside while it is in actual operation.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor integrated circuit, comprising:
    a state machine configured to generate a next state based on a current state and an external input, and to output a state signal indicating the current state;
    a test circuit configured to perform a test of the state machine in a test mode;
    a monitoring circuit configured to monitor, in a normal operation mode, whether or not a state of the state machine is a first state based on the state signal; and
    a detection circuit configured to detect, in the test mode, a transition request signal requesting a transition of the state of the state machine from the first state to a second state,
    wherein when the monitoring circuit decides that the state of the state machine is the first state in the normal operation mode, a mode transfers from the normal operation mode to the test mode, the test circuit performs the test of the state machine, and the state machine continues to output information indicating the first state by the state signal regardless of the state of the state machine in the test mode, and
    when the detection circuit detects the transition request signal in the test mode, the mode transfers from the test mode to the normal operation mode, the test circuit stops the test of the state machine.

2. The semiconductor integrated circuit according to claim 1,
    wherein the state machine includes a first holding circuit configured to hold information indicating the first state, and
    when the monitoring circuit decides that the state of the state machine is the first state in the normal operation mode, the state machine outputs the information held at the first holding circuit by the state signal.

3. The semiconductor integrated circuit according to claim 2, further comprising:
    a first multiplexer configured to select a control input from outside or a test input from the test circuit and to output as the external input; and
    a second multiplexer configured to select an output of the state machine or the information held at the first holding circuit and to output by the state signal,
    wherein the first multiplexer selects the control input and the second multiplexer selects the output of the state machine in the normal operation mode, and
    the first multiplexer selects the test input and the second multiplexer selects the information held at the first holding circuit in the test mode.

4. The semiconductor integrated circuit according to claim 1,
    wherein the state machine includes a second holding circuit configured to hold information indicating the second state, and
    when the detection circuit detects the transition request signal in the test mode, the state machine sets the information held at the second holding circuit to the next state instead of the next state generated by the state machine.

5. The semiconductor integrated circuit according to claim 4,
    wherein the state machine includes:
    a state storage circuit configured to store a current state;
    a state generation circuit configured to generate a next state based on an output of the state storage circuit and the external input;
    a state extraction circuit configured to decode the output of the state storage circuit and to output the state signal; and
    a third multiplexer configured to select the output of the state generation circuit or the information held at the second holding circuit and to output to the state storage circuit,
    wherein when the detection circuit detects the transition request signal in the test mode, the third multiplexer selects and outputs the information held at the second holding circuit.

6. The semiconductor integrated circuit according to claim 1,
    wherein the test circuit includes:
    a generation circuit configured to generate a test pattern; and
    a comparison circuit configured to compare an output value of the state machine and an expected value,
    wherein in the test mode, the generation circuit inputs the generated test pattern to the state machine, the comparison circuit compares the output value of the state machine in accordance with the input test pattern and the expected value.

7. The semiconductor integrated circuit according to claim 1,
    wherein in the test mode, the monitoring circuit stops a monitoring operation as for the state of the state machine.

8. The semiconductor integrated circuit according to claim 1,
    wherein in the normal operation mode, the detection circuit stops a detecting operation as for the transition request signal.

* * * * *